US008419249B2

(12) United States Patent
Yatsuda et al.

(10) Patent No.: US 8,419,249 B2
(45) Date of Patent: Apr. 16, 2013

(54) LIQUID-COOLED LED LIGHTING DEVICE

(75) Inventors: Yasushi Yatsuda, Tokyo (JP); Yasushi Hiramoto, Tokyo (JP); Teruo Koike, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 531 days.

(21) Appl. No.: 12/727,799

(22) Filed: Mar. 19, 2010

(65) Prior Publication Data

US 2010/0264826 A1 Oct. 21, 2010

(30) Foreign Application Priority Data

Apr. 15, 2009 (JP) ................................ 2009-099141
Apr. 15, 2009 (JP) ................................ 2009-099171
Apr. 16, 2009 (JP) ................................ 2009-099683
May 25, 2009 (JP) ................................ 2009-124954

(51) Int. Cl.
  *F21S 8/10* (2006.01)
(52) U.S. Cl.
  USPC ........... 362/545; 362/547; 362/294; 362/362; 165/80.4; 165/80.5; 165/80.2; 313/36; 313/45; 313/46
(58) Field of Classification Search ..................... 315/32, 315/112, 113, 169.1, 291, 307, 312; 362/327, 362/362, 373, 547, 294, 545; 165/80.2–80.5, 165/185, 170, 168; 313/35, 36, 45, 46
  See application file for complete search history.

(56) References Cited

U.S. PATENT DOCUMENTS 7,157,838 B2 * 1/2007 Thielemans et al. ............ 313/35
7,784,971 B2 * 8/2010 Dorogi ........................... 362/294
8,096,348 B2 * 1/2012 Takagi et al. .................. 165/170
8,230,690 B1 * 7/2012 Salessi .............................. 62/3.7
2005/0254013 A1 11/2005 Engle et al.
2009/0195159 A1 * 8/2009 Smith .............................. 315/33
2010/0134017 A1 * 6/2010 Yatsuda et al. ................ 315/113

FOREIGN PATENT DOCUMENTS

| JP | 2002-299700 A | 10/2002 |
| JP | 2006-047914 A | 2/2006 |
| JP | 2007-537490 A | 12/2007 |
| JP | 2009-129642 A | 6/2009 |

* cited by examiner

*Primary Examiner* — Haiss Philogene
(74) *Attorney, Agent, or Firm* — Kenealy Vaidya LLP

(57) ABSTRACT

A cooling liquid can be circulated in a liquid cooling system, so that a light source unit and a control unit can be forcedly cooled by the cooling liquid. Thus, a temperature increase in these components can be suppressed, thereby achieving an increase in the output power of a liquid-cooled LED lighting device. The liquid-cooled LED lighting device can include a housing, a light source unit having LEDs as light sources, a liquid cooling system, and a control unit to control the light source unit to be turned on. The liquid cooling system can include a heat receiving jacket, a radiator, a circulation pump and a fan. The light source unit and the control unit can be disposed with the heat receiving jacket of the liquid cooling system interposed therebetween. Further, one surface of the control unit can be brought in close contact with the heat receiving jacket while a heat radiation portion (e.g., fins or pins) can be provided at an other surface of the control unit.

19 Claims, 12 Drawing Sheets

200W

50W ly polluted gas with hybrid of liquid-cooled
LIQUID-COOLED LED LIGHTING DEVICE This application claims the priority benefit under 35 U.S.C. §119 of Japanese Patent Applications No. 2009-099141 filed on Apr. 15, 2009, No. 2009-099171 filed on Apr. 15, 2009, No. 2009-099683 filed on Apr. 16, 2009, and No. 2009-124954 filed on May 25, 2009, which are hereby incorporated in their entirety by reference.

TECHNICAL FIELD

The presently disclosed subject matter relates to a liquid-cooled LED lighting device that employs a forced cooling system for cooling both a light source unit and a control unit by a coolant. The presently disclosed subject matter also relates to a liquid-cooled LED lighting device that forcedly cools a light source unit by means of liquid as well as forcedly cools a housing accommodating the light source unit by flowing air. The presently disclosed subject matter also relates to a hybrid type liquid-cooled LED lighting device including a liquid cooling system for cooling a light source unit and an air cooling unit.

BACKGROUND ART

In recent years, high intensity lamps, such as mercury lamps, xenon lamps and sodium lamps, used as the light sources of lighting devices such as vehicle headlamps and exterior lighting devices have been replaced with semiconductor light emitting apparatuses (for example, light emitting diodes—LEDs) that have long life and low power consumption. Therefore, there is a demand for higher power LED lighting devices including LEDs as light sources.

Most xenon lamps that are currently in widespread use have an output power of about 200 W to about 2000 W. Therefore, power input to LED lighting devices that are replacing the xenon lamps is also increasing. Recent development shows that the power input to one LED lighting device can be greater than 200 W.

As the power of LED lighting devices increases, the amount of heat generated from the LED light source unit increases. Since the light conversion efficiency of the LED light sources is lowered and life thereof is shortened with an increase in operating temperature, an important task is to develop a cooling structure for reducing the temperature of the LED light sources so as to drive them stably. For example, in a cooling structure proposed in Japanese Patent Application Laid-Open No. 2002-299700, an LED-mounted substrate is pressed against and secured to a metal-made heat dissipating-securing plate by a metal-made heat dissipating cover, and the heat dissipating-securing plate having the LED-mounted substrate secured thereto is disposed in a sealed space formed by a light-transmitting cover and a resin case. A plurality of heat dissipating fins are formed on the heat dissipating-securing plate. In this structure, the heat generated from the LED light sources is transferred to the heat dissipating-securing plate through the LED-mounted substrate and through the heat dissipating cover. The heat transferred to the heat dissipating-securing plate is dissipated into the atmosphere through the heat dissipating fins and the resin case, and the LED light sources are thereby cooled.

Another lighting device disclosed in Japanese Patent Application Laid-Open No. 2006-047914 includes an LED serving as a light source, a heat sink that can cool the LED by an air-cooling or liquid-cooling technique, a light emission circuit configured to apply a current for the LED to emit light, and a water droplet sensor configured to detect whether the lighting device is in the water or not. When the water droplet sensor detects that the lighting device is not in the water, the light emission circuit can control the current to be supplied to the LED, thereby preventing overheating of the LED. On the contrary, when the water droplet sensor detects that the lighting device is in the water, the light emission circuit can control the current to be increased, thereby enhancing the brightness of light emitted from the LED.

A Japanese translation of PCT International Application No. 2007-537490 discloses an air-cooling system utilizing a heat sink and a cooling system utilizing both an air-cooling system and a liquid cooling system.

SUMMARY

However, with the above natural cooling-heat dissipating structures, like the lighting device disclosed in Japanese Patent Application Laid-Open No. 2002-299700, a high cooling effect is not expected, and there is a limit to the increase in the output power.

Further, with the lighting device disclosed in Japanese Patent Application Laid-Open No. 2006-047914, the higher current supply to the LED can be attained only in the case where the lighting device is in the water. Accordingly, when the lighting device not in the water it is mainly cooled by natural heat dissipation only, so that a higher current supply to the LED may not be possible.

It should be noted that such an LED lighting device requires a control unit configured to control a light source unit to be turned on. Such a control unit can have various electronic components, which also generate heat. In view of this, in order to achieve an increase in the output power, the control unit also should be cooled similar to the light source unit.

Further, a housing configured to accommodate the light source unit (which also acts as a heat generation source) and the control unit configured to control the light source unit can be made of a resin material such as a polycarbonate resin or a metal such as aluminum. In order to improve the durability thereof, such a housing needs to be cooled as well.

In a conventional lighting device, however, such a housing is mainly cooled by natural heat dissipation only, and accordingly, any structure and/or mechanism for forced cooling of a housing is not adopted.

Further, when an LED is utilized to form a light distribution pattern suitable for a given lighting device, a front lens can be disposed in front of the LED. Also a transparent front cover can be adopted to prevent an LED from getting dirty in the case where the lighting device is used in the open air. In this case, there is a light chamber space defined by the LED (or surrounding members) and the front cover, that space being separated from outside. When the LED is turned on, heat is generated from the LED to increase the temperature, thereby increasing the pressure within the light chamber space. Accordingly, in order to achieve the increase in the output power, the increase in the pressure within the light chamber space can be prevented or suppressed.

Further, in the LED lighting device with a liquid cooling system, the light source LED rarely breaks down, but a circular pump, fan, or other operation portions constituting the liquid cooling system may break down with more regularity than the LED light source. If such a liquid cooling system is broken, even when a separate air-cooling system is provided, the overheating of the LED may not be completely prevented. In this case, the LED lighting device may be required to be turned off. When a lighting device is used in areas such as gas stations, chemical plants, and the like where dangerous work is carried out, there may be risk in a sudden malfunction of the lighting device.

The presently disclosed subject matter was devised in view of these and other characteristics, features, and problems associated with the conventional art. According to an aspect of the presently disclosed subject matter a liquid-cooled LED lighting device can be provided in which a light source unit and a control unit can be forcedly cooled with cooling liquid, thereby achieving an increase in output power.

According to another aspect of the presently disclosed subject matter, a liquid-cooled LED lighting device can be provided in which a light source unit is forcedly liquid-cooled while a housing accommodating the light source is forcedly air-cooled, thereby achieving an increase in output power.

According to still another aspect of the presently disclosed subject matter, a liquid-cooled LED lighting device can be provided in which a light source unit is forcedly liquid-cooled while a ventilation hole is provided to reduce or suppress the pressure increase within a lighting chamber space.

According to still another aspect of the presently disclosed subject matter, a liquid-cooled LED lighting device can be provided which can achieve a minimum illumination function even when out of order, or when a certain component of the device malfunctions or is broken.

According to still another aspect of the presently disclosed subject matter, a liquid-cooled LED lighting device can include:
a light source unit including an LED as a light source;
a liquid cooling system including a heat receiving jacket and a radiator; and
a control unit configured to control the light source unit to be turned on, wherein
the light source unit and the control unit are disposed with the heat receiving jacket of the liquid cooling system interposed therebetween.

In the liquid-cooled LED lighting device configured as described above, one surface of the control unit can be brought in close contact with the heat receiving jacket while a heat radiation portion can be provided to the other surface of the control unit.

In the liquid-cooled LED lighting device configured as described above, the light source unit can be brought in close contact with the heat receiving jacket via a heat conduction sheet.

In the liquid-cooled LED lighting device configured as described above, the heat receiving jacket and the radiator of the liquid cooling system can be separated away from each other to define a space portion therebetween, and the control unit can be arranged within the space portion.

According to still another aspect of the presently disclosed subject matter, a liquid-cooled LED lighting device can include:
a housing including an inlet port and an discharge port whose axes are disposed perpendicular to each other;
a light source unit including an LED as a light source; and
a liquid cooling system including a heat receiving jacket, a radiator, and a fan, wherein
the housing accommodates the light source unit and at least the radiator and the fan of the liquid cooling system, the radiator and the fan being separated away from each other to define a space portion therebetween, and
an air passage configured to allow a cooling air to partly pass therethrough is formed so that the cooling air is sucked from the inlet port into the housing by the fan and flows along an inner surface of the housing and through the space portion and the radiator, and then exhausted from the discharge port of the housing to the outside.

In the liquid-cooled LED lighting device configured as described immediately above, the inlet port can be formed in a side wall of the housing, the discharge port can be formed in an end wall of the housing in a direction opposite to an light emission direction of the LED, and the radiator and the fan can be disposed near the discharge port.

According to still another aspect of the presently disclosed subject matter, a liquid-cooled LED lighting device can include:
a light source unit including an LED as a light source, a base on which the LED is mounted, a light-transmitting cover disposed in front of the LED in a light emission direction of the LED;
a liquid cooling system including a heat receiving jacket and a radiator; and
a control unit configured to control the light source unit to be turned on, wherein
the base includes an LED mounting portion on one surface thereof and a ventilation hole formed through the base, and
the heat receiving jacket of the liquid cooling system is brought in close contact with the other surface of the base except for an area where the ventilation hole is formed.

In the liquid-cooled LED lighting device configured as described immediately above, the ventilation hole can be formed in a tubular form to project over the rear surface of the heat receiving jacket of the liquid cooling system, and the heat receiving jacket can include a liquid cooling portion disposed to surround the ventilation hole.

In the liquid-cooled LED lighting device configured as described above, the light source unit can be brought in close contact with the heat receiving jacket via a heat conduction sheet.

In the liquid-cooled LED lighting device configured as described above, the heat receiving jacket and the radiator of the liquid cooling system can be separated away from each other to define a space portion, and the control unit can be arranged within the space portion.

According to yet another aspect of the presently disclosed subject matter, a liquid-cooled LED lighting device can include:
a light source unit including an LED as a light source;
a liquid cooling system including a heat receiving jacket and a radiator; and
an air cooling unit including a heat sink disposed near the light source unit.

The liquid-cooled LED lighting device configured as described immediately above can include a circuit casing disposed in close contact with the heat receiving jacket of the liquid cooling system, wherein the heat sink of the air cooling unit can be formed in the circuit casing. In this case, the heat sink can be composed of any of a heat dissipation pin and a heat dissipation fin.

In an alternative embodiment, the heat sink of the air cooling unit may be formed in the heat receiving jacket of the liquid cooling system. Also in this case, the heat sink can be composed of any of a heat dissipation pin and a heat dissipation fin.

The liquid-cooled LED lighting device configured as described above can further include a control unit, and when the liquid cooling system cannot properly operate, the control unit can control a current to be supplied to the light source unit to a given value or less so that heat generated from the light source unit can be absorbed by the air cooling unit.

In the liquid-cooled LED lighting device configured as described above, the light source unit and the air cooling unit can be disposed with the heat receiving jacket of the liquid cooling system interposed therebetween.

The liquid-cooled LED lighting device configured as described above can further include a fan, and the heat receiving jacket of the liquid cooling system, the air cooling unit, the radiator of the liquid cooling system, and the fan can be arranged in that order from the side of the light source unit.

According to the aspect of the presently disclosed subject matter described beginning at paragraph [0019] above, a cooling liquid can be circulated in the liquid cooling system, so that the light source unit and the control unit which are disposed on respective sides of the heat receiving jacket can be forcedly cooled by the cooling liquid. Accordingly, temperature increase in the light source unit and control unit can be suppressed, thereby also achieving an increase in the output power of the liquid-cooled LED lighting device. The cooling liquid can receive heat from the light source unit and the control unit in the heat receiving jacket to increase in temperature. The heated cooling liquid can be cooled in the radiator by heat-exchange with the ambient air, and then supplied to the heat receiving jacket again to cool the light source unit and the control unit. Accordingly, by repeatedly circulating the cooling liquid to perform cooling and heat radiation, the light source unit and the control unit can be continuously and forcedly cooled, so that temperature increases can be suppressed.

Furthermore, one surface of the control unit can be brought in close contact with the heat receiving jacket, and a heat radiation portion can be provided at the other surface thereof. Accordingly, a control circuit therein can be forcedly cooled by the cooling liquid as well as by natural radiation that simultaneously occurs at the heat radiation portion. This can effectively cool the control unit, so that temperature increases can be suppressed more effectively.

In addition, the light source unit can be brought in close contact with the heat receiving jacket via a heat conduction sheet that can be in contact with its entire surface. Thus, the entire surface of the light source unit can serve as a heat transfer surface, so that the light source unit can be effectively cooled by the cooling liquid flowing through the heat receiving jacket. It should be noted that the light source unit can be brought in contact with the heat receiving jacket only in part when a heat conduction sheet is not used, and accordingly, the cooling efficiency may not be increased in this case. Namely, it is difficult to bring the entire surface of the light source unit in close contact with the heat receiving jacket without a heat conduction sheet.

Furthermore, the control unit can be arranged within the space portion defined by the heat receiving jacket and the radiator of the liquid cooling system. Accordingly, the cooling air introduced into the housing by a fan can flow through the space portion, thereby forcedly cooling the control unit. This can effectively suppress any temperature increase by cooling the control unit in both the ways of forcedly cooling it by the air flow and by the cooling liquid.

According to the aspect of the presently disclosed subject matter described above beginning at paragraph [0027], a cooling liquid can be circulated in the liquid cooling system, so that the cooling liquid flowing through the heat receiving jacket can forcedly cool the light source unit. In addition to this, a part of the cooling air introduced from the inlet port into the housing by the fan can flow along the inner surface of the housing so as to forcedly cool the housing. Accordingly, temperature increases of the light source unit can be suppressed, thereby achieving an increase in the output power of the liquid-cooled LED lighting device. Also temperature increases of the housing can be effectively suppressed, thereby improving its durability. Note that the cooling liquid can receive heat from the light source unit in the heat receiving jacket such that the cooling liquid increases in temperature. The heated cooling liquid can be cooled in the radiator by heat-exchange with the cooling air that is being introduced into the housing and passing through the radiator, and then supplied to the heat receiving jacket again to cool the light source unit. Accordingly, by repeatedly circulating the cooling liquid to perform cooling and heat radiation, the light source unit can be continuously and forcedly cooled, so that the temperature increases can be suppressed.

According to the aspect of the presently disclosed subject matter described above at paragraph [0034], the cooling liquid can be circulated in the liquid cooling system, so that the cooling liquid can forcedly cool the light source unit disposed in close contact with the heat receiving jacket. Thus, temperature increases of the light source unit can be suppressed, thereby achieving an increase in output power of the liquid-cooled LED lighting device. The cooling liquid can receive heat from the light source unit and the control unit in the heat receiving jacket such that the cooling liquid increases in temperature. The heated cooling liquid can be cooled in the radiator by heat-exchange with the ambient air, and then supplied to the heat receiving jacket again to cool the light source unit and the control unit. Accordingly, by repeatedly circulating the cooling liquid to perform cooling and heat radiation, the light source unit and the control unit can be continuously and forcedly cooled, so that temperature increases can be suppressed. In addition to this, the ventilation hole can suppress pressure variation in the lighting chamber between the light-transmitting cover and the LED in the light source unit due to the heat generation from the LED.

The tubular ventilation hole can also be cooled by the heat receiving jacket, and accordingly, the temperature variation and the pressure variation can be more effectively suppressed by the air ventilation of the lighting chamber.

In addition, the light source unit can be brought in close contact with the heat receiving jacket via a heat conduction sheet located along its entire surface. Thus, the entire surface of the light source unit can serve as a heat transfer surface, so that the light source unit can be effectively cooled by the cooling liquid flowing through the heat receiving jacket. It should be noted that the light source unit can be brought in contact with the heat receiving jacket only in part when a heat conduction sheet is not used, and accordingly, cooling efficiency may not be increased in this case. Namely, it is difficult to bring the entire surface of the light source unit in close contact with the heat receiving jacket without a heat conduction sheet.

Furthermore, the control unit can be arranged within the space portion defined by the heat receiving jacket and the radiator of the liquid cooling system. Accordingly, the cooling air introduced into the housing by a fan can flow through the space portion, thereby forcedly cooling the control unit. This can effectively suppress temperature increases by cooling the control unit in both the ways of forcedly cooling it by the air flow and by the cooling liquid.

If the liquid cooling system is broken down and the cooling function deteriorates, the LED lighting device according to the aspect of the presently disclosed subject matter described beginning at paragraph [0043] above can supply a lowered current to the light source unit so that heat generated from the light source unit can be absorbed by the air cooling unit. In this case, overheating of the light source unit can be prevented. Furthermore, although the light intensity may be lowered, the LED lighting device can be properly operated without the necessity of turning off.

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

A description will now be made below to exemplary embodiments of liquid-cooled LED lighting devices of the presently disclosed subject matter with reference to the accompanying drawings.

Figure 1:
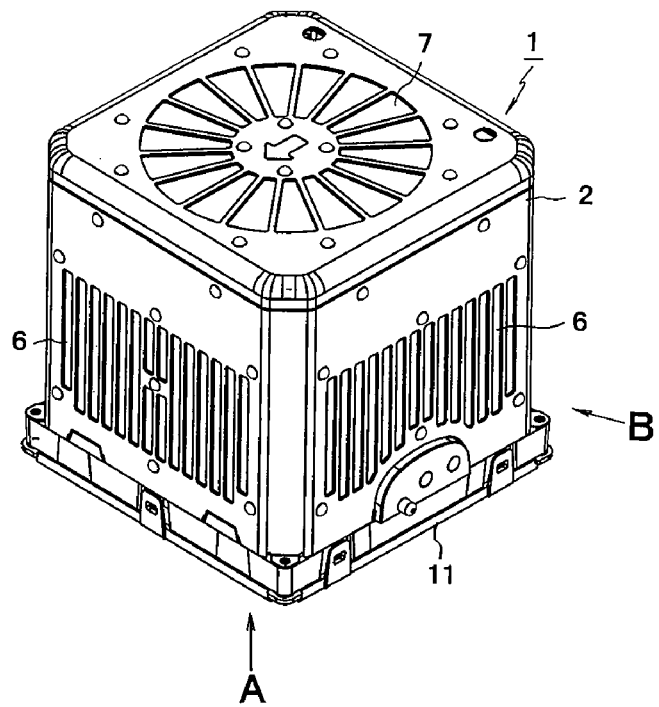
FIG. 1 is a perspective view illustrating a liquid-cooled LED lighting device according to an exemplary embodiment of the presently disclosed subject matter.
Figure 2:
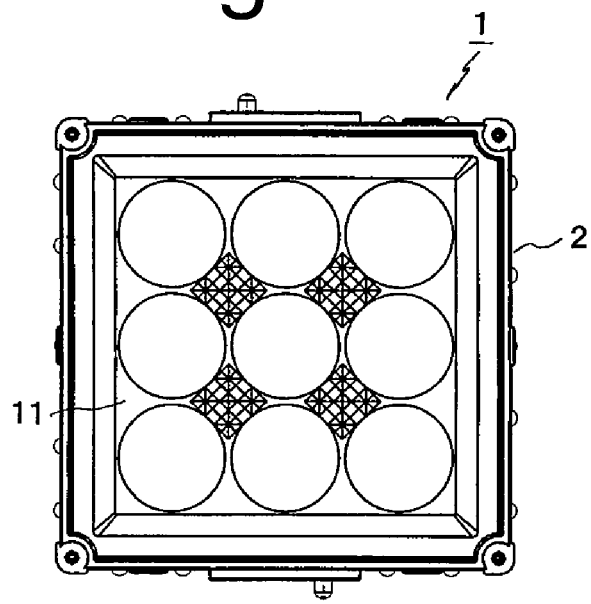
FIG. 2 is a diagram illustrating the liquid-cooled LED lighting device viewed from arrow A in FIG. 1.
Figure 3:
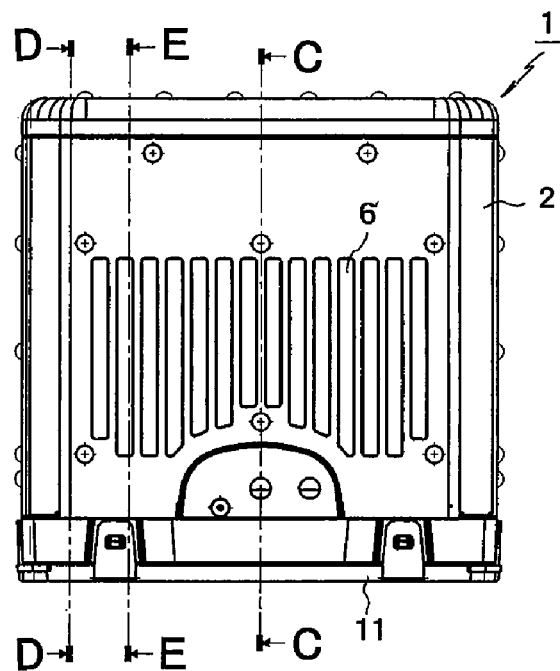
FIG. 3 is a diagram illustrating the liquid-cooled LED lighting device viewed from arrow B in FIG. 1.
Figure 4:
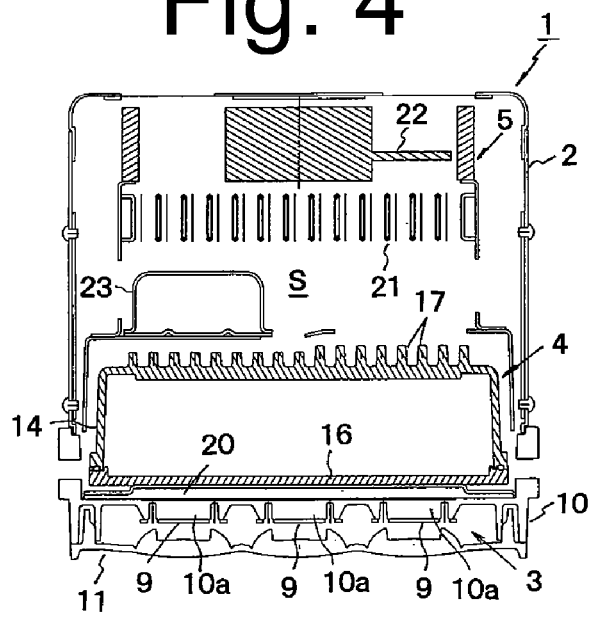
FIG. 4 is a cross-sectional view taken along line C-C of FIG. 3.
Figure 5:
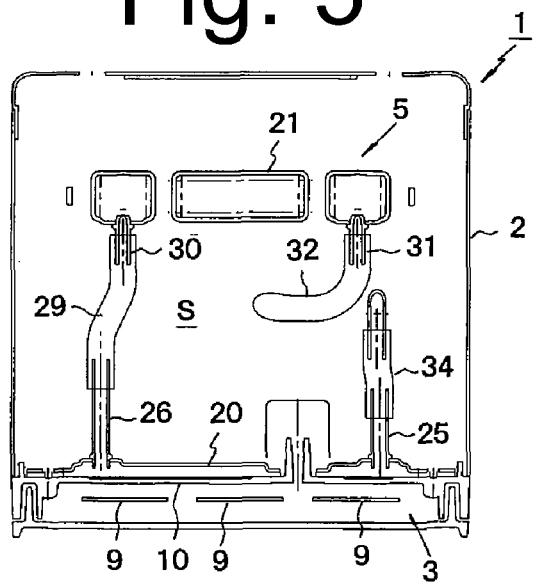
FIG. 5 is a cross-sectional view taken along line D-D of FIG. 3.
Figure 6:
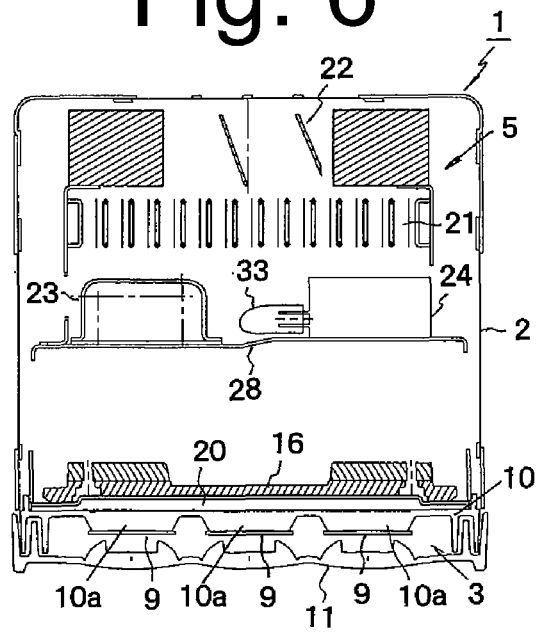
FIG. 6 is a cross-sectional view taken along line E-E of FIG. 3.
Figure 7:
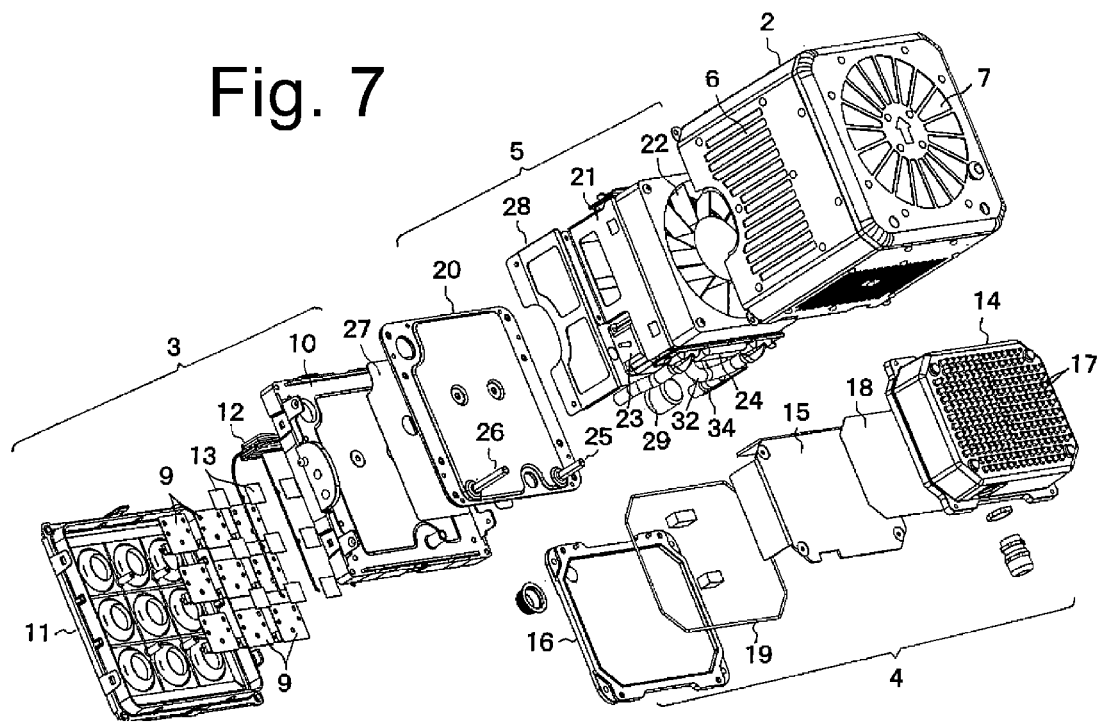
FIG. 7 is an exploded perspective view of a liquid-cooled LED lighting device according to another exemplary embodiment of the presently disclosed subject matter.
Figure 8:
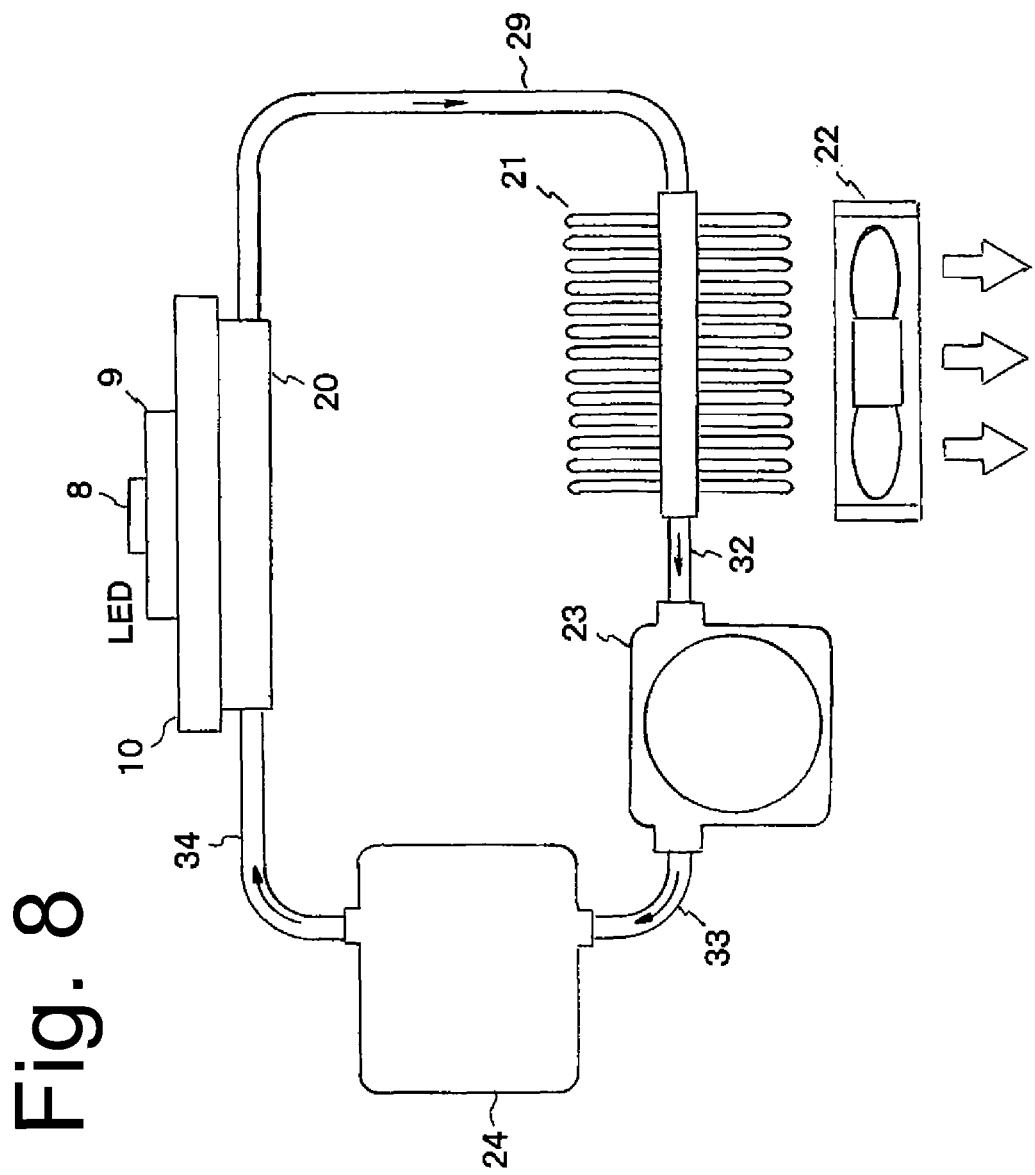
FIG. 8 is a diagram illustrating a basic configuration of a liquid cooling system of a liquid-cooled LED lighting device made in accordance with principles of the presently disclosed subject matter.

FIG. 1 is a perspective view illustrating a liquid-cooled LED lighting device according to an exemplary embodiment of the presently disclosed subject matter. FIG. 2 is a diagram illustrating the liquid-cooled LED lighting device viewed from arrow A in FIG. 1. FIG. 3 is a diagram illustrating the liquid-cooled LED lighting device viewed from arrow B in FIG. 1. FIG. 4 is a cross-sectional view taken along line C-C of FIG. 3. FIG. 5 is a cross-sectional view taken along line D-D of FIG. 3. FIG. 6 is a cross-sectional view taken along line E-E of FIG. 3. FIG. 7 is an exploded perspective view of the liquid-cooled LED lighting device of FIG. 1. FIG. 8 is a diagram illustrating an example of a basic configuration of a liquid cooling system for the liquid-cooled LED lighting device of FIG. 1.

As shown in FIGS. 4 to 7, the liquid-cooled LED lighting device 1 can be configured to include a light source unit 3, a control unit 4, and a liquid cooling system 5 that are incorporated inside a cubic housing 2. It should be noted that an air-cooling heat dissipation system may not be provided if the liquid cooling system 5 is sufficient for the intended purpose.

In the following description of the subject application with reference to FIGS. 1 to 13, the vertical direction (up and down, top and rear and the like) may be determined based on the posture shown in the drawings. In other words, the liquid-cooled LED lighting device 1 may not be installed with the posture illustrated in FIG. 1.

The housing 2 can be formed of a resin material such as polycarbonate (PC) or a metal material such as aluminum. As shown in FIG. 1, inlet ports 6 including a plurality of longitudinal slits can be formed in the side walls of the housing 2. Discharge ports 7 can be formed on the top surface of the housing 2 and can include a plurality of fan shaped slits. The housing 2 can have a lower opening, to which the light source unit 3 is fitted.

The light source unit 3 can be configured to include a metal substrate 9 on which a plurality of (for example, nine (9) as shown in the drawing) LED light sources 8 (see FIG. 8) can be mounted. A rectangular plate-like metal base 10 can be provided to which the metal substrate 9 and so on are attached, and a rectangular plate-like transparent lens 11 can be fitted at the lower opening of the housing 2. In FIG. 7, reference numeral 12 is a cable connector.

The nine metal substrates 9 on which the LEDs 8 have been mounted can be arranged in a 3×3 matrix form. Seats 10a (the number of which is the same as that of the LED 8) can be integrally provided with the metal base 10 prepared by aluminum die casting so that they protrude in a 3×3 matrix form (see FIGS. 4 and 6). The metal substrates 9 can be secured by screws or other connectors or adhesive materials/systems to the respective seats 10a of the metal base 10. The rectangular heat conductive sheets 13 can each be interposed between respective ones of the metal substrates 9 and seats 10a of the metal base 10. The heat conductive sheets 13 can each be formed of a silicone or the like having a high insulation property and heat conductivity.

The control unit 4 can include a cubic circuit casing 14 having a lower opening and a circuit substrate 15 on which various electronic components (not shown) can be mounted, as shown in FIG. 7. The lower opening of the circuit casing 14 can be covered with a rectangular plate-like cover 16. The circuit casing 14 can be molded by aluminum die casting which exhibits high heat conductivity, and a plurality of heat dissipation pins 17 can constitute a heat dissipation portion and can be integrally and protrudingly formed on the top surface of the casing 14. Then, the circuit substrate 15 can be provided in close contact with the inside top surface of the circuit casing 14 with heat conductive sheets 18 intervening between the circuit substrate 15 and the circuit casing 14. The sheets 18 can be made of a silicone that exhibits high insulating and heat conductive properties. An O-ring 19 can be disposed in between the circuit casing 14 and the cover 16 at their jointing portion. The sealing effect of the O-ring 19 can provide a hermetically sealed space within the circuit casing 14 so that dust and moisture can be prevented from entering the inside of the circuit casing 14 from outside. As shown in FIGS. 4 to 8, the liquid cooling system 5 can be configured to include a heat receiving jacket 20 being a heat exchanger; a radiator 21 configured to heat exchange between ambient air flows (cooling air) and a cooling liquid that has been increased in temperature by receiving heat in the heat receiving jacket 20; a fan 22 configured to supply cooling air to the radiator 21; a circulation pump 23 configured to circulate the cooling liquid within a closed loop circulation path; and a reserve tank 24 configured to store the cooling liquid. The fan 22 can be disposed so as to face and be disposed above the radiator 21.

The heat receiving jacket 20 can be formed to have a hollow rectangular plate shape. As shown in FIGS. 4 to 6, the inside of the heat receiving jacket 20 can serve as a passage for allowing the cooling liquid to pass. As shown in FIGS. 5 and 7, the heat receiving jacket 20 can also include, at its end, inlet piping 25 through which the cooling liquid cooled by heat exchange with ambient air at the radiator 21 flows, and a discharge piping 26 from which the cooling liquid that has received heat from the heat receiving jacket 20 is discharged so that they stand upward.

As shown in FIGS. 4 and 6, the heat receiving jacket 20 can be disposed horizontally on the bottom inside of the housing 2. The control unit 4 and the light source unit 3 can be disposed so that the heat receiving jacket 20 is interposed therebetween. The base 10 of the light source unit 3 on the lower side of the heat receiving jacket 20 shown in the drawings can be in close contact with the lower surface of the heat receiving jacket 20 with a rectangular heat conductive sheet 27 interposed therebetween. Furthermore, the heat conductive sheet 27 can be formed of a silicone with high insulating and heat conductive properties.

The cover 16 of the control unit 4 can be disposed on the upper side of the heat receiving jacket 20 so that the cover 16 can be in close contact with the surface of the heat receiving jacket 20. In the present exemplary embodiment, the cooling liquid can be a non-freezing fluid composed of a mixture of water and propylene glycol.

As shown in FIGS. 4 and 6, the radiator 21 and the fan 22 can be disposed above and away from the heat receiving jacket 20 inside the housing 2. A space portion S can be formed between the heat receiving jacket 20 and the radiator 21 so that the control unit 4, the circulation pump 23 and the reserve tank 24 can be disposed inside the space portion S. Specifically, a gate-shaped chassis 28 can be provided on the heat receiving jacket 20, and the control unit 4 can be disposed inside the space surrounded by the chassis 28. The chassis 28 can have the circulation pump 23 and the reserve tank 24 located thereon.

Herein, as shown in FIGS. 5 and 8, a tube (rubber hose) 29 can be provided upward from the discharge piping 26 of the heat receiving jacket 20 and connected to the inlet piping 30 of the radiator 21. A tube (rubber hose) 32 can extend from the discharge piping 31 of the radiator 21 downward, be bent perpendicularly, and be connected to the inlet side of the circulation pump 23. A tube (rubber hose) 33 can extend from the discharging side of the circulation pump 23 and connect to the inlet side of the reserve tank 24 as shown in FIG. 8. Furthermore, a tube (rubber hose) 34 can be provided downward from the outlet side of the reserve tank 24 and connected to the inlet piping 25 of the heat receiving jacket 20. As described above, the heat receiving jacket 20, the radiator 21, the circulation pump 23 and the reserve tank 24 can be connected by the tubes 29 and 32 to 34 (or rubber hoses), so that a closed circulation path is formed. The required cooling effect can be achieved by circulation of the cooling liquid through the circulation path.

The liquid-cooled LED lighting device 1 configured as described above can be activated such that power is supplied to the light source unit 3, the control unit 4 and the liquid cooling system 5. Accordingly, the plurality (nine (9) in the present exemplary embodiment) of LEDs 8 of the light source unit 3 can emit light, which can pass through the lens 11 to be projected downward in FIG. 1, thereby illuminating an area in front of the lighting device 1. The lighting control of the light source unit 3 can be performed by the control unit 4. Accordingly, the LEDs 8 of the light source unit 3 and the various electronic components (not shown) of the control unit 4 can generate heat. If no countermeasure is taken, the light source unit 3 and the control unit 4 may overheat or excessively increase in temperature.

In the present exemplary embodiment, the liquid cooling system 5 can be activated simultaneously with the light source unit 3 and the control unit 4. Accordingly, the light source unit 3 and the control unit 4 can be forcedly cooled by the cooling liquid circulating within the circulation path as shown in FIG. 8. This can decrease the temperature of the device.

Namely, the cooling liquid circulating through the circulation path by means of the circulation pump 23 can receive heat generated by the light source unit 3 and the control unit 4 when the liquid passes through the heat receiving jacket 20. The cooling liquid increases in temperature due to reception of the heat, and can be introduced into the radiator 21 through the tube 29.

When the fan 22 is driven to rotate by a motor (not-shown), ambient air can be introduced into the housing 2 to form a cooling air flowing from the inlet ports 6 formed in the side walls of the housing 2. The cooling air can flow in the space portion S formed between the heat receiving jacket 20 and the radiator 21 upward. The air passing through the radiator 21 can be discharged from the discharge ports 7 formed in the top face of the housing 2 to the outside. In the radiator 21, the heat of the cooling liquid can be dissipated to the outside through the cooling air passing through the radiator 21. The cooling liquid thus decreases in temperature and can be sucked by the circulation pump 23 through the tube 32.

The cooling liquid sucked by the circulation pump 23 can be pressurized and fed to the reserve tank 24 by the circulation pump 23 through the tube 33. Part of the cooling liquid can be stored in the reserve tank 24, and the remainder thereof can be fed from the reserve tank 24 to the heat receiving jacket 20 via the tube 34, thereby cooling the light source unit 3 and the control unit 4 again. The above action (cooling cycle) can be continuously repeated, so that the cooling liquid flowing through the heat receiving jacket 20 can forcedly cool the light source unit 3 and the control unit 4. Accordingly, temperature rise can be suppressed to a predetermined temperature rise or lower.

In the present exemplary embodiment, the control unit 4 and the light source unit 3 can be disposed so that the heat receiving jacket 20 is interposed therebetween. When the circulation pump 23 is activated to circulate the cooling liquid through the closed circulation path, the light source unit 3 and the control unit 4 can be simultaneously and forcedly cooled by the cooling liquid in the heat receiving jacket 20, which is interposed between the light source unit 3 and the control unit 4. As a result, temperature increase in the light source unit 3 and the control unit 4 can be suppressed, thereby achieving an increase in the output power of the liquid-cooled LED lighting device 1.

In the present exemplary embodiment, the lower surface of the control unit 4 is in close contact with the heat receiving jacket 20, and the plurality of heat dissipation pins 17 are protrudingly formed on the upper surface of the control unit 4. In this manner, the control unit 4 can be forcedly cooled by the cooling liquid, and natural heat dissipation can be simultaneously achieved through the heat dissipation pins 17, to thereby effectively cool the control unit 4. Accordingly, a temperature increase can be effectively suppressed. In the present exemplary embodiment, the light source unit 3 can be entirely in closed contact with the lower surface of the heat receiving jacket 20 that includes the heat conductive sheet 27 with high heat conductivity. This means the entire surface of the light source unit 3 can serve as a heat transmission surface, thereby facilitating effective cooling of the light source unit 3 by the cooling liquid through the heat receiving jacket 20. It should be noted that it may be difficult for the entire surface of the light source unit 3 to be in close contact with the heat receiving jacket 20 without the use of the heat conductive sheet 27. Without the heat conductive sheet 27, the light source unit 3 can partly contact with the heat receiving jacket 20 in practice, thereby making it difficult to enhance its cooling effect. For example, if the entire surface of the light source unit 3 is tried to be placed in close contact with the heat receiving jacket 20 without the use of the heat conductive sheet 27, the contacting surface of the heat receiving jacket 20 should be subjected to a smoothening treatment such as a polishing process such that the heat receiving jacket 20 is polished to the same level smoothness as the metal base 10 of the light source unit 3. However, this processing disadvantageously increases the processing steps, man hours, and costs.

Furthermore, in the present exemplary embodiment, the control unit 4 can be disposed in the space portion S formed between the heat receiving jacket 20 and the radiator 21 of the liquid cooling system 5. When cooling air is introduced into the housing 2 by the fan 22 and allowed to flow through the space portion S, it can forcedly cool the control unit 4. In addition to the forced cooling by the cooling liquid, the control unit 4 can be cooled more effectively, thereby suppressing an increase in temperature effectively and sufficiently.

Figure 9:
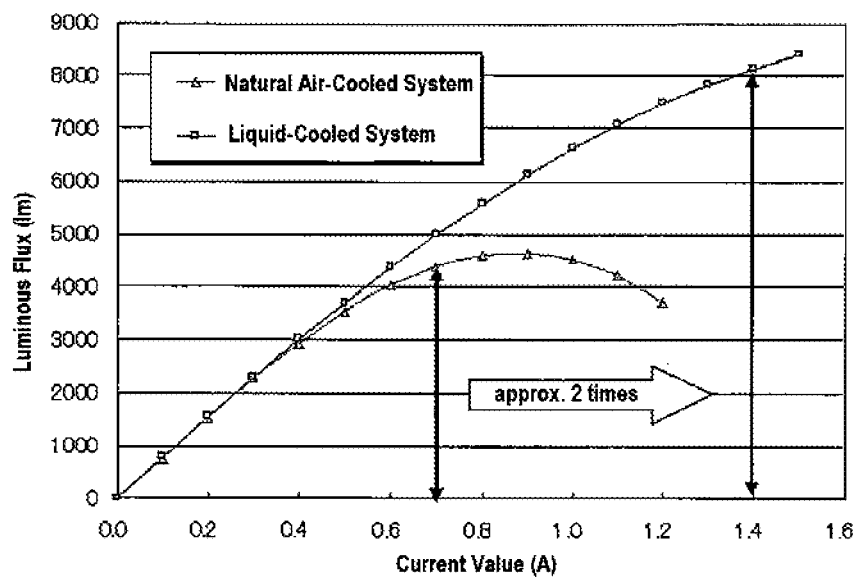
FIG. 9 is a graph showing the relationship between the input current to the LED and the output luminous flux therefrom in a liquid-cooled LED lighting device and a natural air-cooled LED lighting device.
Figure 10:
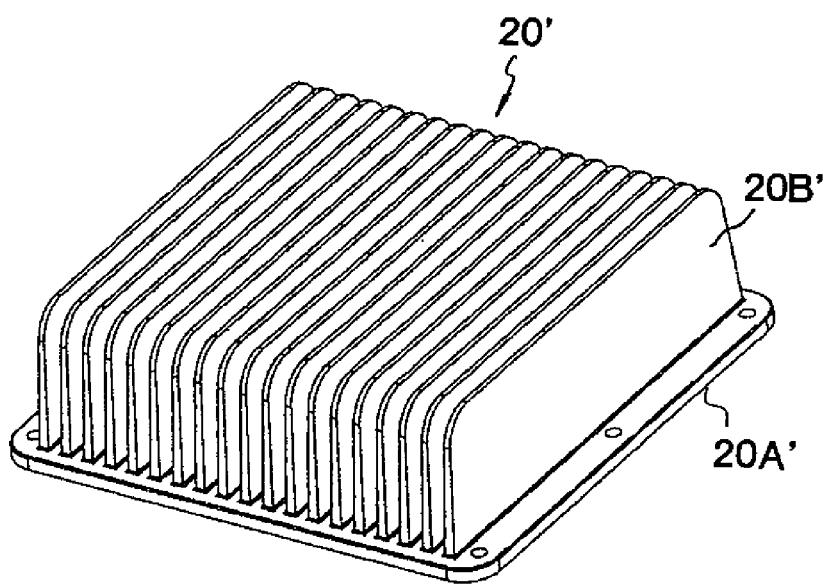
FIG. 10 is a perspective view of a heat sink for use in a liquid-cooled LED lighting device.

FIG. 9 shows the relationship between the input power and the output luminous flux from the LEDs in the liquid-cooled LED lighting device and a natural air-cooled LED lighting device. The natural air-cooled LED lighting device including the same type light source unit 3 and the base 10 can be configured such that an aluminum heat sink 20' as shown in FIG. 10 is attached to a base 10 instead of the heat receiving jacket 20. This LED lighting device was controlled in the same conditions as was the device of the present exemplary embodiment, by means of the control unit 4, so as to turn on the light source unit 3. The heat sink 20' as shown in FIG. 10 can be formed of a base portion 20A' having the same area as that of the heat receiving jacket (the same area as the base 10) and a plurality of flat fins 20B' project from the rear surface of the base portion 20A' (toward the opposite side of the light source unit 3) with a length of 30 to 50 mm.

As shown in FIG. 9, in the natural air cooled LED lighting device, the luminous flux output was significantly lowered when the input power reached about 0.5 A, and the output was further lowered with the input power reached over 1 A. This characteristic would be caused by the temperature characteristics of LEDs (where higher temperature decreases the efficiency).

On the contrary, in the liquid-cooled LED lighting device, the luminous flux output decrease was small even with the input power was over 1 A. The liquid-cooled LED lighting device of the present exemplary embodiment could be operated with a current twice that of the natural air-cooled LED lighting device and could emit light with twofold luminous flux amount.

In general, 5 to 20% of the input power may be wasted as heat in the control unit. Accordingly, with the increased input power, the control unit should be positively cooled. In the present exemplary embodiment, approximately 20 W of heat was generated from the control unit 4. In order to stably operate the control unit, it is desirable to control the ambient temperature of the circuit components to be 80 C or lower. When natural heat dissipation system is adopted, the heat dissipation unit should have a large dimension. For example, if the entire size is equal to that of the present exemplary embodiment, heat dissipation pins 17 with height of 35 mm or more should be formed on the circuit casing 14.

In the liquid-cooled LED lighting device of the presently disclosed subject matter, the control unit 4 can be forcedly cooled by the same cooling manner utilizing the cooling liquid like that used with the light source unit 3. This means no dedicated cooling system for the control unit 4 is required. Accordingly, the size of the entire device can be minimized.

Figure 11:
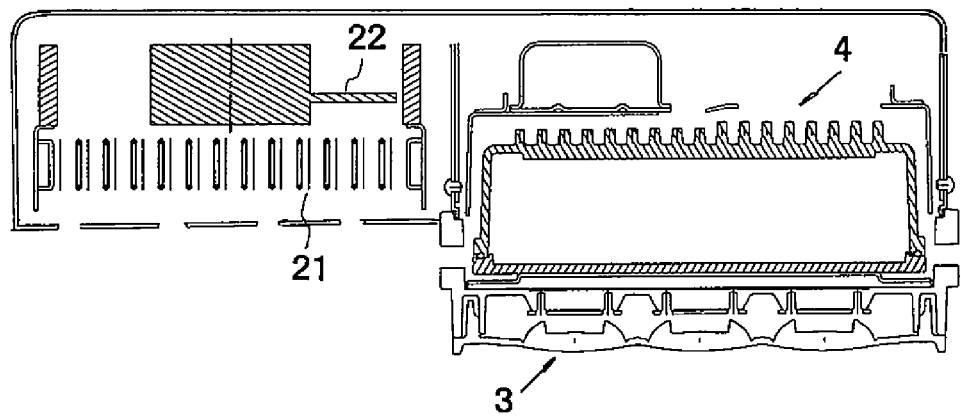
FIG. 11 is a cross-sectional view of a liquid-cooled LED lighting device according to an exemplary embodiment of the presently disclosed subject matter.

Note that in the above described embodiment the radiator 21 and the fan 22 of the liquid cooling system 5 are arranged above the light source unit 3 and the control unit 4 and separated away from them in the vertical direction one by one. Accordingly, the entire height of the device may be enlarged. However, as shown in FIG. 11, the radiator 21 and the fan 22 can be arranged beside the light source unit 3 and the control unit 4, so that the entire height thereof can be lowered.

A description will now be given of another exemplary embodiment of the presently disclosed subject matter with reference to FIGS. 12 and 13. In the present exemplary embodiment, inlet ports 6 can be formed along the peripheral surface of the housing 2 as in the previous exemplary embodiment, and discharge ports 7 including a plurality of fan shaped slits can be formed in the top wall (or end wall) thereof, in the opposite direction (upward in FIG. 1) to the light emission direction of the light source unit 3 (downward in FIG. 1). In this case, when the housing is secured in close contact with the light source unit 3 or the housing 2 is made of a metal or high heat conductive material (for example, a resin material), the heat generated from the light source unit 3 can be effectively dissipated through the housing 2.

In the present exemplary embodiment, the inlet ports 6 formed in the housing 2 can be disposed below the level of the radiator 21 as in the drawing (namely, the radiator 21 is disposed above the position where the upper ends of the inlet ports 6 are positioned). Furthermore, the exhaust ports 7 can be disposed above the radiator 21 as shown in the drawings.

Figure 12:
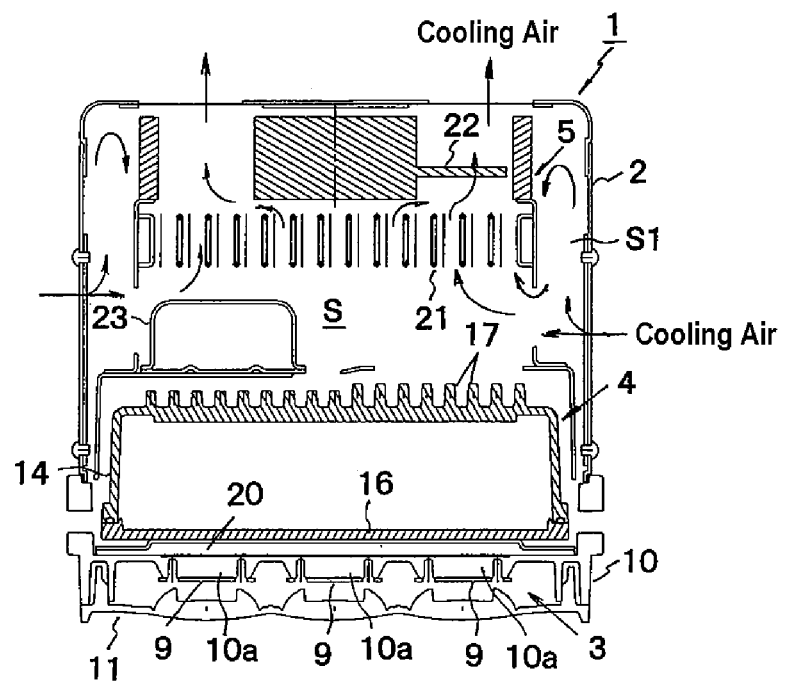
FIG. 12 is a cross-sectional view taken along line C-C of FIG. 3 with air flow directions shown.
Figure 13:
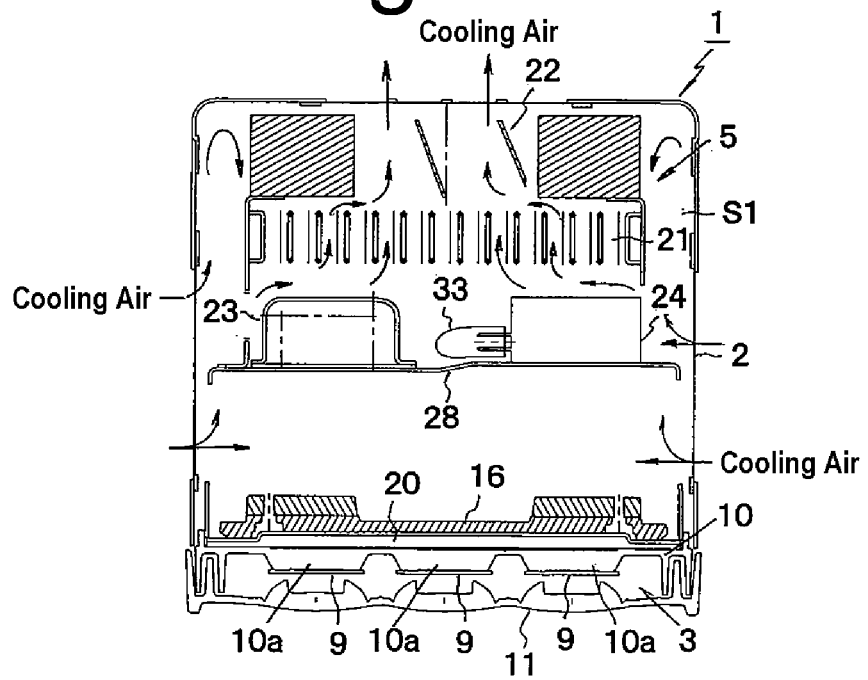
FIG. 13 is a cross-sectional view taken along line E-E of FIG. 3 with air flow directions shown.

As shown in FIGS. 12 and 13, the radiator 21 and the fan 22 can be disposed in the vicinity of the exhaust ports 7 above and away from the heat receiving jacket 20 by a predetermined distance within the housing 2. A space portion S is formed between the heat receiving jacket 20 and the radiator 21, and an air passage S1 is formed along the inner peripheral surface of the housing 2. Then, the control unit 4, the circular pump 23 and the reserve tank 24 can be arranged within the space portion S in the housing 2. Specifically, a gate-shaped chassis 28 can be provided on the heat receiving jacket 20, and the control unit 4 can be disposed inside the space surrounded by the chassis 28. The circulation pump 23 and the reserve tank 24 can be located on the chassis 28.

In the present exemplary embodiment, as shown in FIG. 13, the outer diameter of the inlet ports 6 can be set to be larger than that of the fan 22, and the outer diameter of the radiator 21 can be set to be approximately twice the outer diameter of the fan 22. In addition to this, the surface area of the housing 2 can be set to be twice the surface area of the radiator 21.

The liquid-cooled LED lighting device 1 as configured above can be activated to supply power to the light source unit 3, the control unit 4 and the liquid cooling system 5. Accordingly, the plurality (nine (9) in the present exemplary embodiment) of LEDs 8 of the light source unit 3 can emit light, which can pass through the lens 11 to be projected downward in FIG. 1, thereby illuminating the area in front of the lighting device 1. The lighting control of the light source unit 3 can be performed by the control unit 4. Accordingly, the LEDs 8 of the light source unit 3 and the various electronic components (not shown) of the control unit 4 can generate heat. If no countermeasure is taken, the light source unit 3 and the control unit 4 may overheat and/or excessively increase in temperature.

In the present exemplary embodiment, the liquid cooling system 5 can be activated at the same time as the light source 3. Accordingly, the light source unit 3 and the control unit 4 can be forcedly cooled by the cooling liquid circulating within the circulation path as shown in FIG. 8. This can decrease the temperature of the device. In addition to this, the fan 22 can introduce a cooling air flow from the inlet ports 6 of the housing 2 into the housing 2. Part of the cooling air flow can forcedly cool the housing 2, thereby suppressing a temperature increase of the housing 2.

Namely, the cooling liquid circulating through the circulation path by means of the circulation pump 23 can receive the heat generated by the light source unit 3 and the control unit 4 when passing through the heat receiving jacket 20. The cooling liquid which is increased in temperature due to reception of the heat can be introduced into the radiator 21 through the tube 29.

When the fan 22 is driven to rotate by a motor (not-shown), ambient air can be introduced into the housing 2 as cooling air flowing from the inlet ports 6 formed in the side walls of the housing 2. Part of the cooling air can flow along the air passage S1 formed along the inner peripheral surface of the housing 2, as shown by arrows in FIGS. 12 and 13, thereby forcedly cooling the housing 2 to suppress a temperature increase thereof.

The cooling air that has been introduced into the housing 2 (including the cooling air that has cooled the housing 2) can flow in the space portion S formed between the heat receiving jacket 20 and the radiator 21 upward, as shown by arrows in FIGS. 12 and 13. The air passing through the radiator 21 can be discharged from the discharge ports 7 formed in the top face of the housing 2 to the outside. In the radiator 21, the heat of the cooling liquid can be dissipated to the outside through the cooling air passing through the radiator 21. The cooling liquid that is thus decreased in temperature can be sucked by the circulation pump 23 through the tube 32.

The cooling liquid sucked by the circulation pump 23 can be pressurized and fed to the reserve tank 24 by the circulation pump 23 through the tube 33. Part of the cooling liquid can be stored in the reserve tank 24. The remainder of the cooling liquid can be fed from the reserve tank 24 to the heat receiving jacket 20 via the tube 34, thereby cooling the light source unit 3 and the control unit 4 again. The above action (cooling cycle) can be continuously repeated, so that the cooling liquid flowing through the heat receiving jacket 20 can forcedly cool the light source unit 3 and the control unit 4. Accordingly, a temperature increase can be suppressed to a predetermined temperature increase or lower. In addition to this, part of the cooling air can forcedly cool the housing 2, thereby suppressing temperature increase thereof to a given value or lower.

When the circulation pump 23 is activated to circulate the cooling liquid through the closed circulation path in the liquid cooling system 5 of the present embodiment, the light source unit 3 can be forcedly cooled by the cooling liquid in the heat receiving jacket 20, which can be interposed therebetween. As a result, a temperature increase of the light source unit 3 can be suppressed, thereby achieving an increase in the output power of the liquid-cooled LED lighting device 1.

In addition to the above system, the fan 22 can introduce a cooling air flow from the inlet ports 6 into the housing 2, and part of the cooling air can flow along the air passage S1 formed along the inner peripheral surface of the housing 2, thereby forcedly cooling the housing 2. Also, a temperature increase of the housing 2 can be effectively suppressed, thereby improving its durability. In an exemplary embodiment, the dimension of the air passage S1 can be 0.3 times to 1 time of the outermost size (diameter) of the blade portion of the fan 22, and particularly, 0.4 times to 0.6 times thereof. The dimension setting like this can facilitate the introduction of cooling air to flow through the air passage S1. When the air passage S1 has a larger dimension than the outermost size (diameter) of the blade portion of the fan 22, the amount of cooling air reaching the radiator 21 would decrease. In particular, the housing 2 is utilized to serve as a duct to effectively introduce the cooling air to the radiator 21. This can increase the air speed around the radiator 21, thereby improving the cooling performance.

Note that the housing 2 or chassis 18 may be provided with a rectifying plate to form an air passage that positively guides the cooling air. In particular, this structure can facilitate the flowing of the cooling air to the radiator 21, thereby accelerating the air speed of the cooling air passing through the radiator 21. Accordingly, the cooling performance can be improved.

The heat receiving jacket 20 can include a first substantially planar side and a second substantially planar side opposite to the first substantially planar side. The first substantially planar side can be substantially parallel with respect to the second substantially planar side, and can both be oriented substantially perpendicular to the light emitting direction of the lighting device 1. The heat conductive sheet 27 can be substantially planar and can have a first planar side that directly contacts a majority of or substantially all of the area defined by the entire extent of the first substantially planar side of the heat receiving jacket 20. The circuit casing 14 can include a substantially planar surface that is in direct contact with a majority of or substantially all of the area defined by the entire extent of the second substantially planar side of the heat receiving jacket 20. Likewise, a majority of or substantially all of the area defined by the entire extent of the substantially planar surface of the circuit casing 14 can be in direct contact with the second substantially planar side of the heat receiving jacket 20. The entire extent of a side or surface can be defined as the entire area located within a single plane that contains the side or surface.

The metal base 10 can include a substantially planar surface that is in direct contact with a majority of or substantially all of the area defined by the entire extent of a second planar side of the heat conductive sheet 27. Likewise, a majority of or substantially all of the area defined by the entire extent of the substantially planar surface of the metal base 10 can be in direct contact with the second planar side of the heat conductive sheet 27.

The circuit casing can include a heat dissipation structure, such as pins 17, located on a surface that is opposed to and substantially parallel with the substantially planar surface of the circuit casing 14 that is in direct contact with the second substantially planar side of the heat receiving jacket 20. The heat dissipation structure can extend in a direction substantially perpendicular (i.e. almost or entirely perpendicular) to the substantially planar surface of the circuit casing 14.

Figure 14:
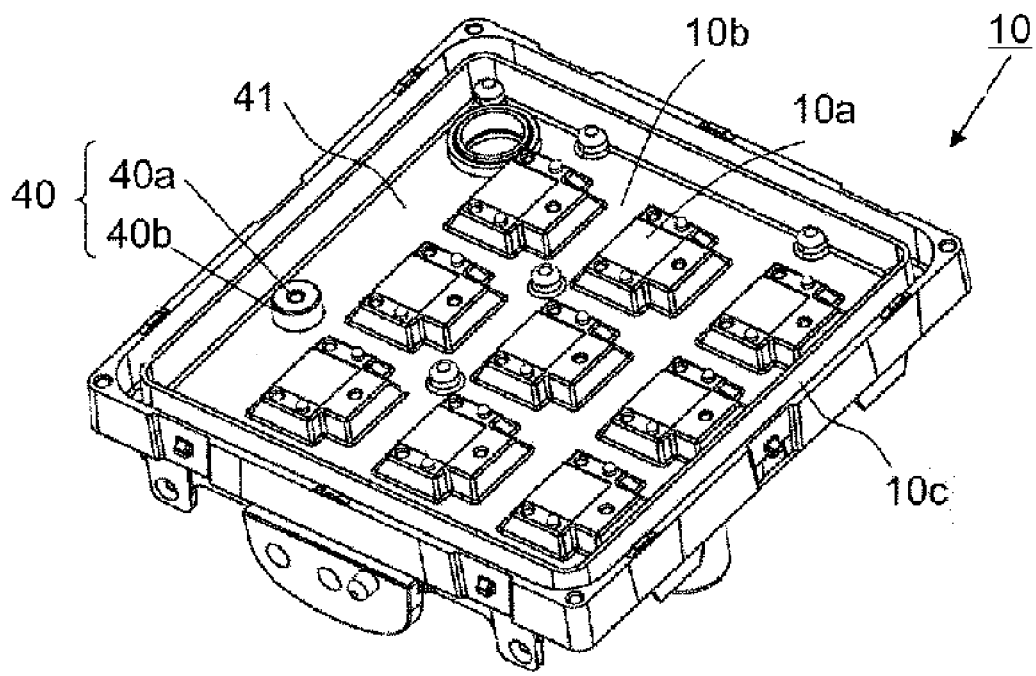
FIG. 14 is a perspective view showing the base of a liquid-cooled LED lighting according to an exemplary embodiment of the presently disclosed subject matter when viewed from the LED mounting side.
Figure 15:
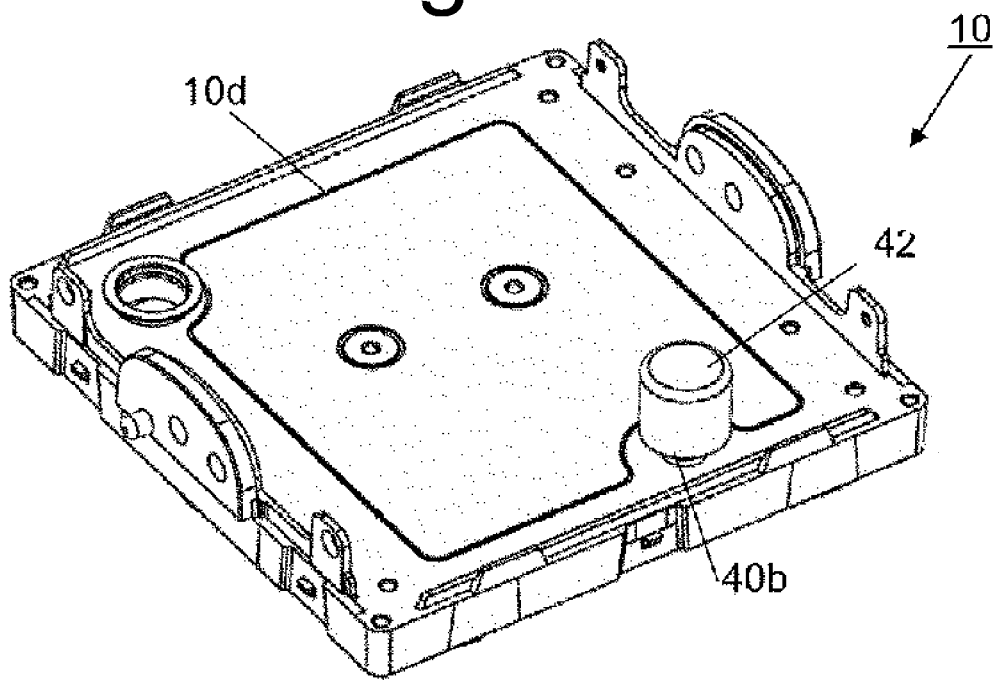
FIG. 15 is a perspective view showing the base of FIG. 14 when viewed from its rear side.

A description will now be given of another exemplary embodiment of the presently disclosed subject matter with reference to FIGS. 14 and 15. The present exemplary embodiment is different from the previous exemplary embodiment in that a ventilation hole 40 is provided on the base 10. FIG. 14 is a perspective view showing the base of the liquid-cooled LED lighting device according to the present exemplary embodiment when viewed from the LED mounting side. FIG. 15 is a perspective view showing the base of the liquid-cooled LED lighting device when viewed from its rear side.

The light source unit 3 can be the same as that of the previous exemplary embodiment as shown in FIGS. 4 to 7, and can have a plurality of LEDs 8 serving as light sources, mounted on one side of the base 10. The base 10 can have an LED mounting portion 10b and a plurality of seats 10a disposed on the LED mounting portion 10b. A lens 11 can be disposed in front of the LEDs 8 (in the illumination direction), so that the space may form a mazy structure. Alphanumeral 10c denotes a surrounding groove for attaching the lens 11. An adhesive can be charged into the surrounding groove 10c and then the lens 11 inserted into the surrounding groove 10c at leg portions of the lens 11 to secure the lens 11. The space defined by the lens 11 and the base 10 in which the LEDs 8 are installed can serve as the light chamber space 41 (see FIG. 4). The ventilation hole 40 can be formed at a position in the base 10 where the seats 10a are not disposed. The ventilation hole 40 can be formed in an area between the LED mounting portion 10b and the surrounding groove 10c, so that one ventilation opening 40a is exposed within the light chamber space 41.

The ventilation hole 40 can protrude into the LED mounting side of the base 10 in the form of a tube. The protruding height thereof can be the same as the seats 10a. Setting the protruding height being the same as the seats 10a can allow the ventilation opening 40a to be disposed at the same height as the LEDs 8, and thus, the air with the same temperature distribution can be ventilated through the ventilation opening 40a.

On the rear surface side of the base 10, or the opposite side to the LED mounting side, a tubular ventilation hole can be formed of a tubular portion 40b and a ventilation opening 40a that communicates with the ventilation opening 40a on the LED mounting side. Note that the ventilation hole 40 on the rear surface side can be covered with a ventilation cap 42, as shown in FIG. 15. The ventilation cap 42 can include a sponge-like material so that dirt can be prevented from entering the light chamber space 41 through the ventilation hole 40.

On the rear surface of the base 10, a heat conduction sheet installing portion 10d can be provided that has a thickness decreased by the thickness of the to-be-disposed heat conduction sheet 27 (or recessed) when compared with the surrounding area so that the heat receiving jacket 20 can be brought into tight contact with the base 10 through the heat conduction sheet 27. Part of the heat conduction sheet installing portion 10d can surround the ventilation hole 40 at least halfway, as shown in FIG. 15. Namely, the heat receiving jacket, or more specifically, the portion of the heat conduction jacket 20 through which the cooling liquid circulates (liquid-cooling portion), can be positioned surrounding the ventilation hole 40. This structure can cool the ventilation hole 40 from its outside. The ventilation hole 40 can serve as a space for transferring a gas to/from the light chamber space 41. Accordingly, if the portion where a gas passes can be cooled efficiently, the gas flow can be improved by convective action. The height of the ventilation hole 40 to be projected over the rear surface of the base 10 can be made thicker than the total thickness of the base 10 and the heat receiving jacket 20 when the heat receiving jacket 20 is attached. Accordingly, the ventilation hole 40 can protrude over the rear surface of the heat receiving jacket or, more specifically, can protrude into the space portion S. The ventilation hole 40 can be positioned in the vicinity of the inlet ports 6 of the housing 2, thereby improving the air flow by another air flow from the ventilation hole 40.

Next, a description will be given of a modified example of the liquid-cooled LED lighting device according to the exemplary embodiment of FIG. 1. In the present example, in the LED lighting device 1 as shown in FIGS. 4 to 7 the control unit 4 can also serve as an air cooling unit. Since the modified example has almost the same function and advantages, other than the characteristic function and advantages, as those of the liquid-cooled LED lighting device according to the exemplary embodiment of FIG. 1, any redundant description will be omitted here.

The air cooling unit 4 in the present modified example can include the cubic circuit casing 14 having a lower opening. The cubic circuit casing 14 can function as a heat sink. The circuit casing 14 can accommodate a circuit substrate 15 on which various electronic components (not-shown) are mounted. The lower opening thereof can be covered with a rectangular plate-like cover 16. The circuit casing 14 can be molded by aluminum die casting with a high heat conductivity, and a plurality of heat dissipation pins 17 constituting the heat dissipation portion can be protrudingly formed integrally on the top surface of the casing 14. Then, the circuit substrate 15 can be provided in close contact with the inside top surface of the circuit casing 14 with the heat conductive sheets 18 intervening therebetween. The sheet 18 can be made of a silicone with high insulating and heat conductive properties. An O-ring 19 can be disposed in between the circuit casing 14 and the cover 16 at their jointing portion. The sealing effect of the O-ring 19 can provide a hermetically sealed space within the circuit casing 14, so that dust and moisture can be prevented from entering the inside of the circuit casing 14 from outside. In the present modified example, the heat dissipation pins 17 can be protrudingly provided on the circuit casing 14 to serve as an atmospheric heat dissipation portion. In place of the heat dissipation pins 17, heat dissipation fins may be formed or other heat dissipation structure can be provided on the circuit casing 14.

As shown in FIGS. 4 and 6, the heat receiving jacket 20 of the present exemplary embodiment can be disposed horizontally on the bottom inside of the housing 2. The air cooling unit 4 and the light source unit 3 can be disposed so that the heat receiving jacket 20 is interposed therebetween. The cover 16 of the air cooling unit 4 can be disposed on the upper side of the heat receiving jacket 20 so that the cover 16 can be in close contact with the surface of the heat receiving jacket 20.

As shown in FIGS. 4 and 6, the radiator 21 and the fan 22 can be disposed above and away from the heat receiving jacket 20 inside the housing 2. A space portion S can be formed between the heat receiving jacket 20 and the radiator 21, so that the air cooling unit 4, the circulation pump 23 and the reserve tank 24 can be disposed inside the space portion S.

The liquid-cooled LED lighting device 1 as configured above can be activated, to supply power to the light source unit 3, and to the circuit substrate 15 with the liquid cooling system 5 within the circuit casing 14. Accordingly, the plurality (nine (9) in the present exemplary embodiment) of LEDs 8 of the light source unit 3 can emit light, which can pass through the lens 11 and projected downward as shown in FIG. 1, thereby illuminating the area in front of the lighting device 1. The lighting control of the light source unit 3 can be performed by a circuit formed in the circuit substrate 15 inside the circuit casing 14. Accordingly, the LEDs 8 of the light source unit 3 and the various electronic components (not shown) on the circuit substrate 15 can generate heat. If no countermeasure is taken, the light source unit 3 and the circuit substrate 15 may overheat and/or excessively increase in temperature.

In the present exemplary embodiment, at the same time when the light source unit 3 is activated, the liquid cooling system 5 can be activated. Accordingly, the light source unit 3 and the circuit casing 14 serving as the heat sink of the air cooling unit 4 can be forcedly cooled by the cooling liquid circulating within the circulation path as shown in FIG. 8 and as described above. This can decrease the temperature of the device. The heat generated from the light source unit 3 and the circuit substrate 15 can be transferred to the circuit casing 14 and dissipated from the surface of the circuit casing 14 and the plurality of heat dissipation pins 17 that constitute the air cooling unit 4. Heat dissipation can be facilitated by the cooling air flowing from the inlet ports 6 to the discharge ports 7 within the housing 2 by the fan 22.

In the liquid-cooling unit 5, the cooling liquid circulating through the circulation path by means of the circulation pump 23 can receive the heat generated by the light source unit 3 and the circuit substrate 15 when passing through the heat receiving jacket 20, thereby cooling the light source unit 3, the circuit casing 14, and the circuit substrate 15 accommodated in the casing 14. The cooling liquid that is increased in temperature due to reception of the heat can be introduced into the radiator 21 through the tube 29.

When the fan 22 is driven to rotate by a motor (not-shown), ambient air can be sidewardly introduced into the housing 2 as cooling air flows from the inlet ports 6 formed in the side walls of the housing 2. The cooling air can flow in the space portion S formed between the heat receiving jacket 20 and the radiator 21 upward. The air passing through the radiator 21 can be discharged from the discharge ports 7 formed on the top surface of the housing 2 to the outside. In the radiator 21, the heat of the cooling liquid can be dissipated to the outside through the cooling air passing through the radiator 21. The cooling liquid that is decreased in temperature can be sucked by the circulation pump 23 through the tube 32.

The cooling liquid sucked by the circulation pump 23 can be pressurized and fed to the reserve tank 24 by the circulation pump 23 through the tube 33. Part of the cooling liquid can be stored in the reserve tank 24, and the remainder thereof can be fed from the reserve tank 24 to the heat receiving jacket 20 via the tube 34, thereby cooling the light source unit 3, the circuit casing 14 and the inside circuit substrate 15 again. The above action (cooling cycle) can be continuously repeated, so that the cooling liquid flowing through the heat receiving jacket 20 can forcedly cool the light source unit 3, the circuit casing 14 and the circuit substrate 15. Accordingly, a temperature increase can be suppressed to a predetermined temperature increase or lower.

In the present exemplary embodiment, the air cooling unit 4 and the light source unit 3 can be disposed so that the heat receiving jacket 20 is interposed therebetween. When the circulation pump 23 is activated to circulate the cooling liquid through the closed circulation path, the light source unit 3, the circuit casing 14 and the circuit substrate 15 can be simultaneously and forcedly cooled by the cooling liquid in the heat receiving jacket 20, which can be interposed therebetween. In addition to this, the heat dissipation from the air cooling unit 4 can air-cool the circuit casing 14 and the circuit substrate 15. As a result, a temperature increase of the light source unit 3 and the circuit substrate 15 can be suppressed, thereby achieving an increase in the output power of the liquid-cooled LED lighting device 1.

Furthermore, in the present exemplary embodiment, the lower surface of the circuit casing 14 can be in close contact with the heat receiving jacket 20, and the plurality of heat dissipation pins 17 can be protrudingly formed on the upper surface of the circuit casing 14. In this manner, the circuit casing 14 can be forcedly cooled by the cooling liquid, and simultaneously natural heat dissipation can be achieved through the heat dissipation pins 17, thereby effectively cooling the circuit casing 14 and the inside circuit substrate 15. Accordingly, a temperature increase can be suppressed more effectively.

In the present exemplary embodiment, the light source unit 3 can be entirely in closed contact with the lower surface of the heat receiving jacket 20 with the heat conductive sheet 27 that has high heat conductivity. This means the entire surface of the light source unit 3 can serve as a heat transmission surface, thereby facilitating effective cooling of the light source unit 3 by the cooling liquid through the heat receiving jacket 20. It should be noted that it may be difficult for the entire surface of the light source unit 3 to be in close contact with the heat receiving jacket 20 without the use of the heat conductive sheet 27. Without the heat conductive sheet 27, the light source unit 3 may only be able to be partly in contact with the heat receiving jacket 20 in practice, thereby making it difficult to enhance its cooling effect. If it is tried to place the entire surface of the light source unit 3 in close contact with the heat receiving jacket 20 without the use of the heat conductive sheet 27, the contacting surface of the heat receiving jacket 20 should be subjected to a smoothening treatment such as polishing processing to provide the same level smoothness as the metal base 10 of the light source unit 3. However, this processing disadvantageously increases the processing steps, man hours, and costs.

Furthermore, in the present exemplary embodiment, the air cooling unit 4 can be disposed in the space portion S formed between the heat receiving jacket 20 and the radiator 21 of the liquid cooling system 5. When cooling air is introduced into the housing 2 by the fan 22 and allowed to flow through the space portion S, it can forcedly cool the circuit casing 14 and the circuit substrate 15. In addition to the forced cooling by the cooling liquid, the circuit casing 14 and the circuit substrate 15 can be cooled more effectively, thereby suppressing an increase in temperature effectively and sufficiently.

In the liquid-cooled LED lighting device 1, when the liquid cooling system 5 which has operating portions such as the fan 22 and the circulation pump 23 does not work properly due to some problem (namely, the cooling function is damaged), the current that is to be supplied to the LEDs 8 of the light source unit 3 can be controlled to a value such that heat generated by the LEDs 8 can be absorbed by the air cooling unit 4.

Accordingly, if the liquid cooling system 5 is broken and the cooling function cannot work, the current to be supplied to the LEDs 8 of the light source unit 3 can be controlled and reduced. This control can suppress the heat generated by the LEDs 8 to the heat amount that can be absorbed by the air cooling unit 4, i.e., the heat that can be sufficiently dissipated from the circuit casing 14 and the heat dissipation pins 17, thereby preventing overheating of the light source unit 3. In this case, although the illumination intensity from the LED lighting device 1 may be lowered due to the suppressed current, the LED lighting device 1 can be properly operated without the necessity of turning off. If the LED lighting device 1 is used in a gas station or a chemical plant where dangerous work may be carried out, accidental shut off of the light can be prevented, thereby ensuring high safety in such areas.

Figure 16:
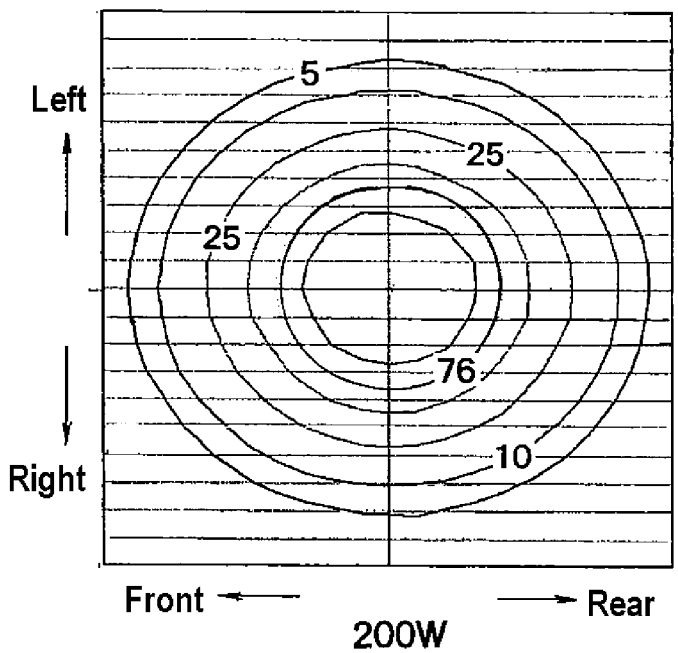
FIG. 16 is a graph showing an exemplary illumination intensity distribution when an embodiment of the LED lighting device is driven with an output of 200 W.

In the liquid-cooled LED lighting device 1 of the present exemplary embodiment, when the air cooling unit 4 and the liquid cooling system 5 are properly operated, the output at which the junction temperature of the LED 8 does not exceed 100 C is 200 W. FIG. 16 shows the illumination intensity distribution when the LED lighting device 1 is driven with an output of 200 W. As shown in FIG. 16, the LED lighting device 1 can illuminate an area of approximately 8 m square with an illumination intensity of 5 lx or more. It should be noted that the illumination intensity was observed when the LED lighting device was installed at a height of 6 m (the same condition is applied in the cases depicted in FIGS. 17 and 18). In the graph, the vertical axis is the distance in the right-to-left direction on the ground and the horizontal axis is the distance in the front-to-rear direction on the ground (unit: meter), and the numeral indicated in the graph is the illumination intensity (unit: lx). (The same is applied to the cases depicted in FIGS. 17 and 18).

Figure 17:
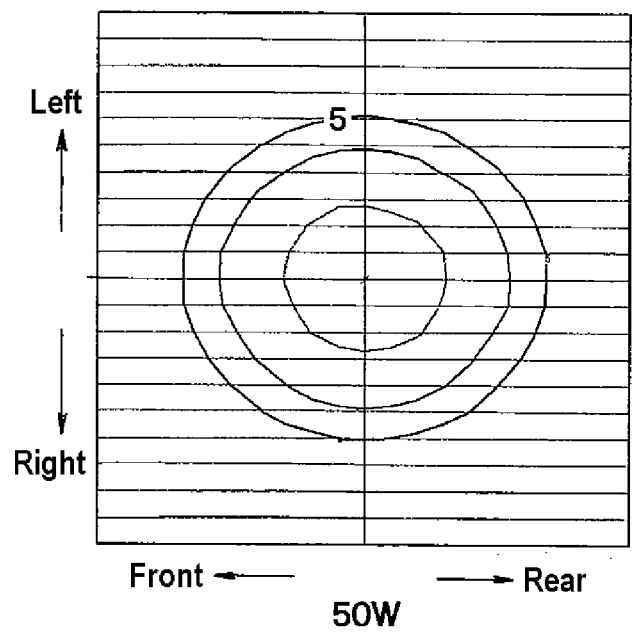
FIG. 17 is a graph showing an exemplary illumination intensity distribution when an embodiment of the LED lighting device is driven with an output of 50 W.
Figure 18:
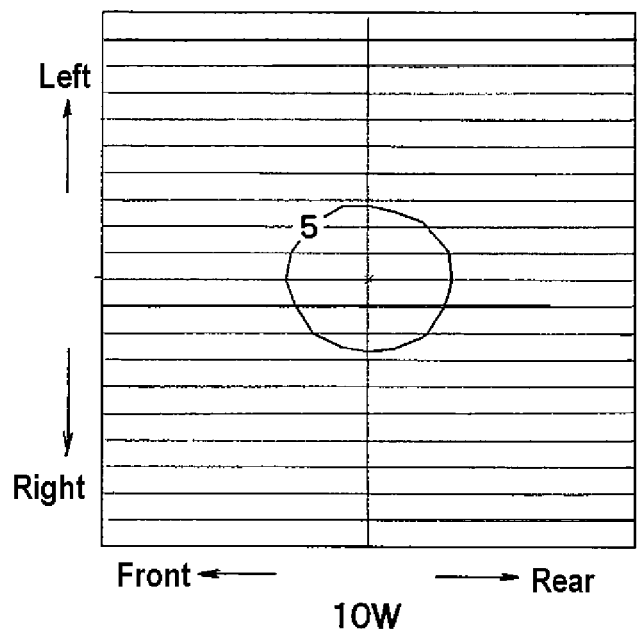
FIG. 18 is a graph showing an exemplary illumination intensity distribution when an embodiment of the LED lighting device is driven with an output of 10 W.

If the liquid cooling system 5 is broken and the cooling function cannot work, the current to be supplied to the LEDs 8 of the light source unit 3 can be controlled and reduced. For example, the output can be suppressed to 50 W, which is one-fourth of the normal output of 200 W. In this case, the illumination intensity is lowered, but the continuing function as a lighting device is not damaged. FIG. 17 shows the illumination intensity distribution when the LED lighting device 1 is driven with an output of 50 W. As shown in FIG. 17, the LED lighting device 1 can illuminate an area of approximately 6 m square with an illumination intensity of 5 lx or more. Suppose that when the LED lighting device 1 does not have the air cooling unit 4, but only has the liquid cooling system 5 and the liquid cooling system 5 is broken, the cooling is achieved only by natural heat dissipation from the surface of the heat receiving jacket 20. In this case, the output with which the junction temperature of the LED 8 does not exceed 100 C is 10 W, which is one-twentieth of the normal output of 200 W. FIG. 18 shows the illumination intensity distribution when the LED lighting device 1 is driven with an output of 10 W. As shown in FIG. 18, the LED lighting device 1 can illuminate an area of approximately 3 m square with an illumination intensity of 5 lx or more. A description will be given of still another exemplary embodiment of the presently disclosed subject matter with reference to FIGS. 19 and 20.

Figure 19:
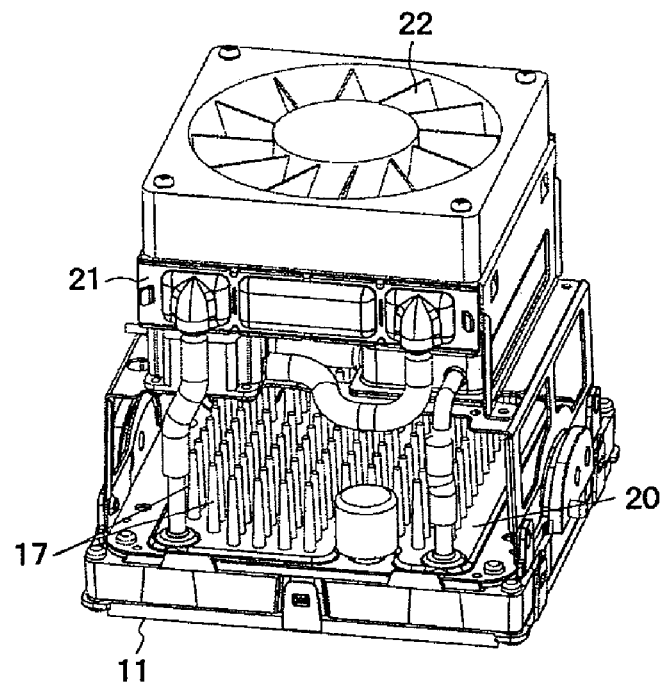
FIG. 19 is a perspective view of a liquid-cooled LED lighting device according to still another exemplary embodiment of the presently disclosed subject matter when a housing is removed.
Figure 20:
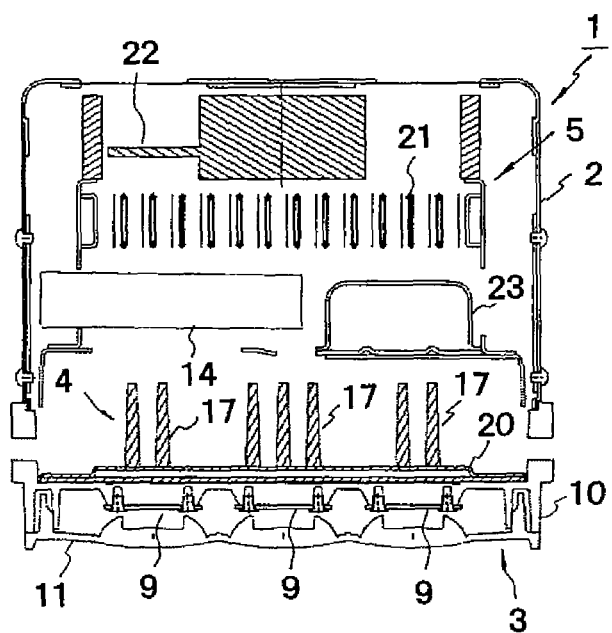
FIG. 20 is a longitudinal cross-sectional view illustrating the liquid-cooled LED lighting device of FIG. 19.

FIG. 19 is a perspective view of a liquid-cooled LED lighting device made in accordance with principles of the presently disclosed subject matter when a housing structure is removed, and FIG. 20 is a longitudinal cross-sectional view of the liquid-cooled LED lighting device.

The liquid-cooled LED lighting device 1' of the present exemplary embodiment can include a heat sink for the air cooling unit 4 that can be constituted by a plurality of heat dissipation pins 17 formed in the heat receiving jacket 20 of the liquid cooling system 5. The remainder of the configuration can be the same as the LED lighting device 1 of the previous exemplary embodiment. Accordingly, the same or similar components in FIGS. 19 and 20 are denoted by the same reference numerals as those in FIGS. 1 to 8, and descriptions thereof will be omitted hereinafter.

As in the previous exemplary embodiment, in the present exemplary embodiment, when the liquid cooling system 5, which has operating portions such as a fan 22 and a circulation pump 23, cannot work properly due to some problem (namely, the cooling function of the system 5 is damaged), the current that is to be supplied to the LEDs 8 of the light source unit 3 can be controlled to a value such that heat generated by the LEDs 8 can be absorbed by the air cooling unit 4.

Accordingly, when the liquid cooling system 5 cannot work properly due to some problem and the cooling function thereof is damaged, the current to be supplied to the LEDs 8 of the light source unit 3 can be controlled to a value such that heat generated by the LEDs 8 can be absorbed by the air cooling unit 4. Namely, this control can suppress the heat generated by the LEDs 8 to the heat amount that can be absorbed by the heat receiving jacket 20 and the heat dissipation pins 17, thereby preventing overheating of the LEDs 8. Although the illumination intensity from the LED lighting device 1' may be lowered due to the suppressed current, the function as a lighting device is not damaged and the LED lighting device 1 can be properly operated without the necessity of turning off as in the previous exemplary embodiment.

In the present exemplary embodiment, the heat dissipation pins 17 can be formed in the heat receiving jacket 20. However, the presently disclosed subject matter is not limited to this, and heat dissipation fins or other heat transfer structure may be formed in the heat receiving jacket 20 instead of the heat dissipation pins 17. The heat dissipation pins 17 and/or the heat dissipation fins can be integrally formed with the heat receiving jacket 20. Alternatively, separate heat dissipation pins 17 and/or separate heat dissipation fins can be fixed to the heat receiving jacket 20 by soldering, calking, screwing or the like. When separate heat dissipation pins 17 or fins are fixed to the heat receiving jacket 20 by soldering or the like, the pins and/or fins can be formed of thin metal springs or thin metal bellows. The shape of the atmospheric heat dissipation portion can be the same shape as those generally used for a heat sink.

The liquid-cooled LED lighting device of the presently disclosed subject matter can be used as lighting devices, including exterior lighting devices such as street lamps, garden lamps, and various sports arena lighting devices.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A liquid-cooled LED lighting device, comprising:
a light source unit including an LED as a light source;
a liquid cooling system including a heat receiving jacket and a radiator; and
a control unit configured to control the light source unit to be turned on, wherein
the light source unit and the control unit are disposed with the heat receiving jacket of the liquid cooling system interposed therebetween.

2. The liquid-cooled LED lighting device according to claim 1, wherein one surface of the control unit is in close and direct contact with the heat receiving jacket and a heat radiation portion is provided at an other surface of the control unit.

3. The liquid-cooled LED lighting device according to claim 1, wherein the light source unit is in close contact with the heat receiving jacket via a heat conduction sheet.

4. The liquid-cooled LED lighting device according to claim 1, wherein the heat receiving jacket and the radiator of the liquid cooling system are separated away from each other to define a space portion therebetween, and the control unit is located within the space portion.

5. The liquid-cooled LED lighting device according to claim 1, wherein the light source unit includes a base, and the base includes an LED mounting portion on one surface of the base and a ventilation hole formed through the base such that air can pass from one side of the base to an opposite side of the base.

6. The liquid-cooled LED lighting device according to claim 1, wherein the heat receiving jacket includes an inlet structure, a discharge structure, and a liquid located in the heat receiving jacket.

7. A liquid-cooled LED lighting device comprising:
a light source unit including an LED as a light source, a base on which the LED is mounted, a light-transmitting cover disposed in front of the LED in a light emission direction of the LED;
a liquid cooling system including a heat receiving jacket and a radiator; and
a control unit configured to control the light source unit to be turned on, wherein
the base includes an LED mounting portion on one surface of the base and a ventilation hole formed through the base, and
the heat receiving jacket of the liquid cooling system is in close contact with an other surface of the base except for an area where the ventilation hole is formed.

8. The liquid-cooled LED lighting device according to claim 7, wherein the ventilation hole is formed in a tubular form to project completely through the heat receiving jacket of the liquid cooling system, and the heat receiving jacket includes a liquid cooling portion surrounding the ventilation hole.

9. The liquid-cooled LED lighting device according to claim 7, wherein the light source unit is in close contact with the heat receiving jacket via a heat conduction sheet.

10. The liquid-cooled LED lighting device according to claim 7, wherein the heat receiving jacket and the radiator of the liquid cooling system are separated away from each other to define a space portion, and the control unit is located within the space portion.

11. A liquid-cooled LED lighting device comprising:
a light source unit including an LED as a light source;
a liquid cooling system including a heat receiving jacket and a radiator;
an air cooling unit including a heat sink disposed adjacent the light source unit; and
a circuit casing disposed in close contact with the heat receiving jacket of the liquid cooling system, wherein the heat sink of the air cooling unit is formed in the circuit casing and includes at least one of a heat dissipation pin and a heat dissipation fin.

12. The liquid-cooled LED lighting device according to claim 11, wherein the heat receiving jacket includes an inlet structure, a discharge structure, and a liquid located in the heat receiving jacket, and the air cooling unit includes a fan.

13. A liquid-cooled LED lighting device comprising:
a light source unit including an LED as a light source;
a liquid cooling system including a heat receiving jacket and a radiator; and
an air cooling unit including a heat sink disposed adjacent the light source unit,
wherein the heat sink of the air cooling unit is formed in the heat receiving jacket of the liquid cooling system, and includes at least one of a heat dissipation pin and a heat dissipation fin.

14. A liquid-cooled LED lighting device comprising:
a light source unit including an LED as a light source;
a liquid cooling system including a heat receiving jacket and a radiator;
an air cooling unit including a heat sink disposed adjacent the light source unit; and
a control unit, and wherein the control unit is configured such that when the liquid cooling system cannot properly operate, the control unit controls a current to be supplied to the light source unit to a given value or less so that heat generated from the light source unit can be absorbed by the air cooling unit.

15. A liquid-cooled LED lighting device comprising:
a light source unit including an LED as a light source;
a liquid cooling system including a heat receiving jacket and a radiator; and
an air cooling unit including a heat sink disposed adjacent the light source unit,
wherein the light source unit and the air cooling unit are disposed with the heat receiving jacket of the liquid cooling system interposed therebetween.

16. A liquid-cooled LED lighting device comprising:
a light source unit including an LED as a light source;
a liquid cooling system including a heat receiving jacket and a radiator;
an air cooling unit including a heat sink disposed adjacent the light source unit; and
a fan, and wherein the heat receiving jacket of the liquid cooling system, the air cooling unit, the radiator of the liquid cooling system, and the fan are arranged in that order from a side of the light source unit.

17. A liquid-cooled LED lighting device comprising:
a housing including an inlet port and a discharge port whose axes are disposed perpendicular to each other;
a light source unit including an LED as a light source; and
a liquid cooling system including a heat receiving jacket, a radiator, and a fan, wherein
the housing accommodates the light source unit and at least the radiator and the fan of the liquid cooling system, the radiator and the fan being separated away from the heat receiving jacket to define a space portion therebetween, and
an air passage configured to allow cooling air to partly pass therethrough and formed so that the cooling air is sucked from the inlet port into the housing by the fan and flows along an inner surface of the housing and through the space portion and the radiator, and then exhausted from the discharge port of the housing to an outside area.

18. The liquid-cooled LED lighting device according to claim 17, wherein the inlet port is formed in a side wall of the housing, the discharge port is formed in an end wall of the housing located in a direction opposite to a light emission direction of the LED, and the radiator and the fan are disposed adjacent the discharge port.

19. A liquid-cooled LED lighting device comprising:
a light source unit including an LED as a light source;
a liquid cooling system including a heat receiving jacket and a radiator; and
an air cooling unit including a heat sink disposed adjacent the light source unit,
wherein the light source unit includes a base, and the base includes an LED mounting portion on one surface of the base and a ventilation hole formed through the base such that air can pass from one side of the base to an opposite side of the base.

* * * * *